United States Patent
Fu et al.

(10) Patent No.: US 10,461,170 B2
(45) Date of Patent: Oct. 29, 2019

(54) METHOD OF FORMING MOSFET STRUCTURE

(71) Applicant: Taiwan Semiconductor Manufacturing Company Limited, Hsinchu (TW)

(72) Inventors: Ching-Feng Fu, Taichung (TW); Yu-Chan Yen, Taipei (TW); Chih-Hsin Ko, Kaohsiung (TW); Chun-Hung Lee, Hsinchu (TW); Huan-Just Lin, Hsinchu (TW); Hui-Cheng Chang, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/146,135

(22) Filed: May 4, 2016

(65) Prior Publication Data
US 2016/0247896 A1    Aug. 25, 2016

Related U.S. Application Data

(63) Continuation of application No. 14/178,399, filed on Feb. 12, 2014, now Pat. No. 9,343,412.

(51) Int. Cl.
*H01L 29/66* (2006.01)
*H01L 29/78* (2006.01)
*H01L 29/161* (2006.01)
*H01L 23/00* (2006.01)
*H01L 29/08* (2006.01)
(Continued)

(52) U.S. Cl.
CPC ...... *H01L 29/66545* (2013.01); *H01L 23/564* (2013.01); *H01L 29/0847* (2013.01); *H01L 29/161* (2013.01); *H01L 29/165* (2013.01); *H01L 29/66795* (2013.01); *H01L 29/785* (2013.01); *H01L 29/7848* (2013.01); *H01L 29/7851* (2013.01); *H01L 21/31144* (2013.01); *H01L 2924/0002* (2013.01)

(58) Field of Classification Search
CPC ... H01L 29/66545; H01L 29/66; H01L 29/78; H01L 29/161; H01L 29/785
USPC .......................................... 257/211
See application file for complete search history.

(56) References Cited

U.S. PATENT DOCUMENTS

| 8,728,927 | B1 * | 5/2014 | Cheng | .................. | H01L 21/486 257/E21.658 |
| 2006/0246666 | A1 * | 11/2006 | Han | ...................... | H01L 27/105 438/263 |
| 2010/0068875 | A1 |  3/2010 | Yeh et al. | | |

(Continued)

FOREIGN PATENT DOCUMENTS

CN       1855446 A       11/2006

OTHER PUBLICATIONS

Chinese Office Action; Application No. 201410169123.8; dated May 11, 2017.

*Primary Examiner* — Fazli Erdem
(74) *Attorney, Agent, or Firm* — Jones Day

(57) ABSTRACT

A method includes providing a semiconductor structure that includes an epitaxial layer and a cap layer above the epitaxial layer, filling a trench above the cap layer with a sacrificial layer, and removing the sacrificial layer. As such, the cap layer is protected by the sacrificial layer during an etching process and the epitaxial layer is protected by the cap layer during another etching process.

20 Claims, 10 Drawing Sheets

(51) Int. Cl.
*H01L 29/165* (2006.01)
*H01L 21/311* (2006.01)

(56) References Cited

U.S. PATENT DOCUMENTS

| | | |
|---|---|---|
| 2011/0201164 A1 | 8/2011 | Chung et al. |
| 2011/0248348 A1 | 10/2011 | Gan et al. |
| 2012/0091528 A1* | 4/2012 | Chang ................ H01L 29/7848 |
| | | 257/347 |
| 2013/0065371 A1 | 3/2013 | Wei et al. |
| 2013/0200470 A1* | 8/2013 | Liu .................... H01L 29/66795 |
| | | 257/408 |
| 2013/0330898 A1* | 12/2013 | Liao ................... H01L 29/66636 |
| | | 438/285 |
| 2014/0004677 A1* | 1/2014 | Li ..................... H01L 21/823814 |
| | | 438/299 |
| 2014/0134818 A1* | 5/2014 | Cheng ............... H01L 29/66636 |
| | | 438/300 |
| 2014/0154846 A1* | 6/2014 | Cheng ............... H01L 29/66772 |
| | | 438/151 |
| 2014/0162452 A1 | 6/2014 | Cheng et al. |
| 2014/0191300 A1 | 7/2014 | Jhaveri et al. |
| 2014/0217480 A1 | 8/2014 | Kronholz et al. |
| 2014/0273468 A1 | 9/2014 | Huang et al. |
| 2014/0335674 A1* | 11/2014 | Liao ................... H01L 29/66636 |
| | | 438/285 |
| 2015/0069473 A1* | 3/2015 | Glass ................. H01L 21/02175 |
| | | 257/288 |
| 2015/0129988 A1* | 5/2015 | Leobandung ......... H01L 29/785 |
| | | 257/410 |
| 2015/0228776 A1* | 8/2015 | Xie ......................... H01L 29/78 |
| | | 257/288 |

* cited by examiner

METHOD OF FORMING MOSFET STRUCTURE

CROSS-REFERENCE TO RELATED APPLICATION

The present application is a continuation of U.S. patent application Ser. No. 14/178,399, filed on Feb. 12, 2014, which is incorporated by reference herein in its entirety.

FIELD

This disclosure relates to semiconductor technology, and more particularly, a method of forming a MOSFET structure.

BACKGROUND

During formation of a FinFET structure, a source/drain portion including a cap layer and an epitaxial layer may be hurt by several etching processes. If the source/drain portion is hurt, after a gate metal layer is formed within the FinFET structure, a silicon fin of the FinFET structure may be in direct contact with an epitaxial silicon definition layer of the Fin structure. Therefore, leakage of the gate metal layer may be introduced, and operation failure may occur because of the leakage.

DETAILED DESCRIPTION

FIGS. 1-5 illustrate cross-sectional views of a FinFET structure 100 during formation of the FinFET structure 100.

Figure 1:
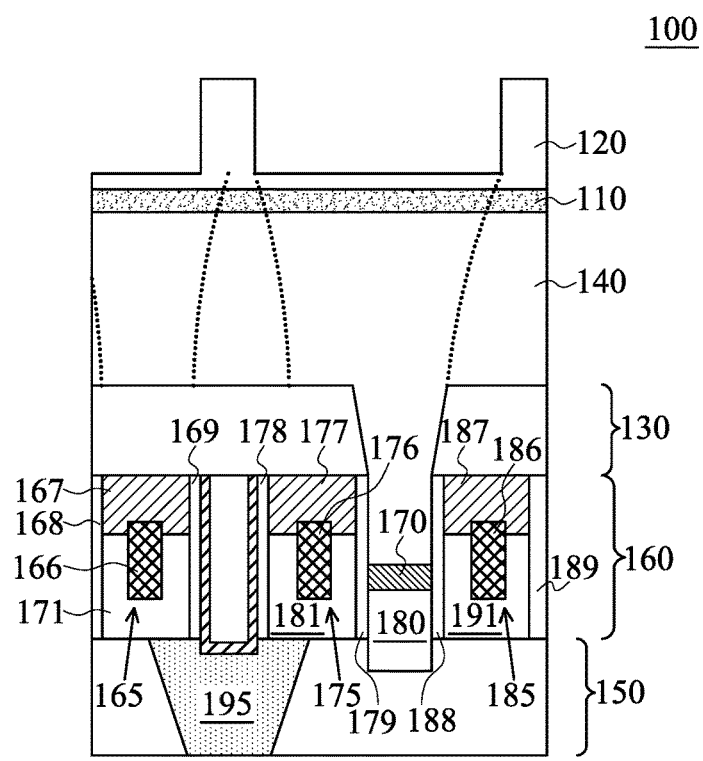
FIGS. 1-5 illustrate cross-sectional views of a FinFET structure during formation of the FinFET structure.

In FIG. 1, the FinFET structure 100 initially includes a first photoresist layer 110, a second photoresist layer 120, an inter-layer dielectric (ILD) layer 130, a bottom photoresist layer 140, a gate layer 160, a substrate layer 150, a cap layer 170, and an epitaxial layer 180. A source/drain portion of the FinFET structure 100 includes the cap layer 170 and the epitaxial layer 180. A tri-layer photoresist technique may be employed to form the first photoresist layer 110, the second photoresist layer 120 and the bottom photoresist layer 140, wherein the first photoresist layer 110 may be formed of a mixture of a photoresist material and silicon, the second photoresist layer 120 may be formed of a photoresist material, and the bottom photoresist layer 140 may be formed of polymer. The term "bottom" of the bottom photoresist layer 140 refers to a relative position with respect to the first photoresist layer 110 and the second photoresist layer 120, and does not limit scopes of the claims.

The gate layer 160 may include three exemplary gate portions, including a first gate 165, a second gate 175, and a third gate 185. The first gate 165 includes a first metal portion 166, a first gate ceiling 167, a first gate bottom 171, a first left-side spacer 168, and a first right-side spacer 169.

The second gate 175 includes a second metal portion 176, a second gate ceiling 177, a second gate bottom 181, a second left-side spacer 178, and a second right-side spacer 179. The third gate 185 includes a third metal portion 186, a third gate ceiling 187, a third gate bottom 191, a third left-side spacer 188, and a third right-side spacer 189.

The first gate ceiling 167, the second gate ceiling 177, and the third gate ceiling 187 may consist essentially of silicon nitride.

The FinFET structure 100 may further include a shallow trench isolation (STI) layer 195 for isolation. The STI layer 195 is interposed between the first gate 165 and the second gate 175.

Figure 2:
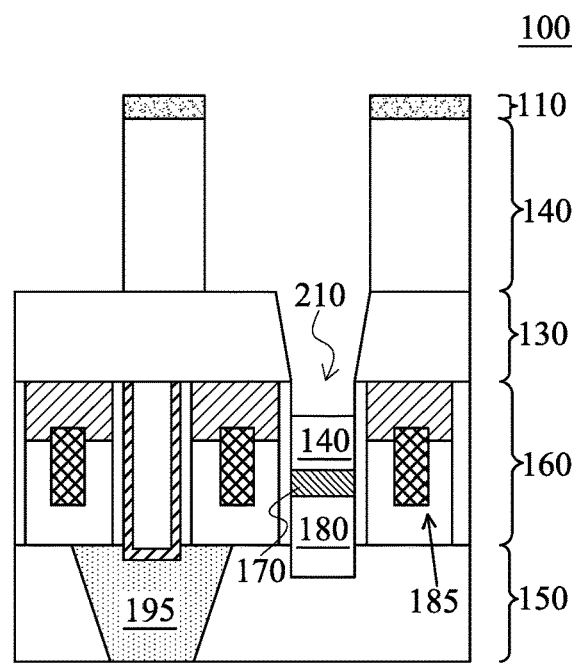

In FIG. 2, a first etching process is performed. The second photoresist layer 120 is substantially etched. Part of the first photoresist layer 110 and part of the bottom photoresist layer 140 are also substantially etched following a pattern of the second photoresist layer 120 for forming a first trench 210. Part of the ILD layer 130 is exposed in the first etching process.

An etchant utilized in the first etching process may have a high selectivity with the ILD layer 130.

Figure 3:
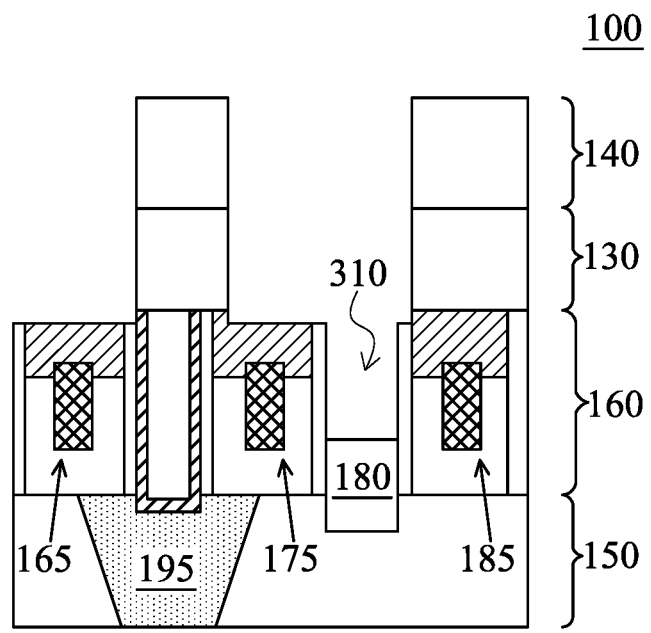

In FIG. 3, a second etching process is performed. The first photoresist layer 110 is substantially etched. Part of the bottom photoresist layer 140 within the first trench 210 and the cap layer 170 are substantially etched to form a second trench 310. An exposed portion of the ILD layer 130 is substantially etched. An etchant used in the second etching process may have a similar selectivity with the ILD layer 130, the bottom photoresist layer 140, and the second gate ceiling.

As can be observed in FIG. 3, since the cap layer 170 is substantially etched, the epitaxial layer 180 is not substantially covered and protected by the cap layer 170 in the following processes.

Figure 4:
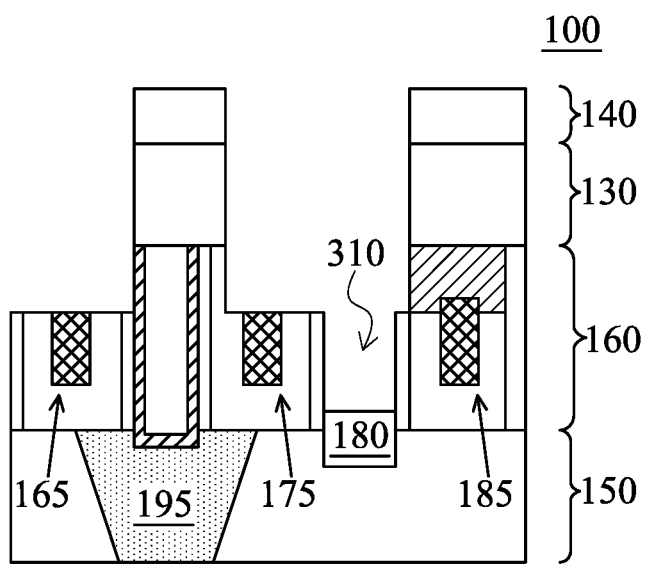

In FIG. 4, a third etching process is performed. The second gate ceiling and part of the second right-side spacer protecting the second gate ceiling are substantially etched. An etchant used in the third etching process may have a high selectivity with the ILD layer 130 and the epitaxial layer 180.

Figure 5:
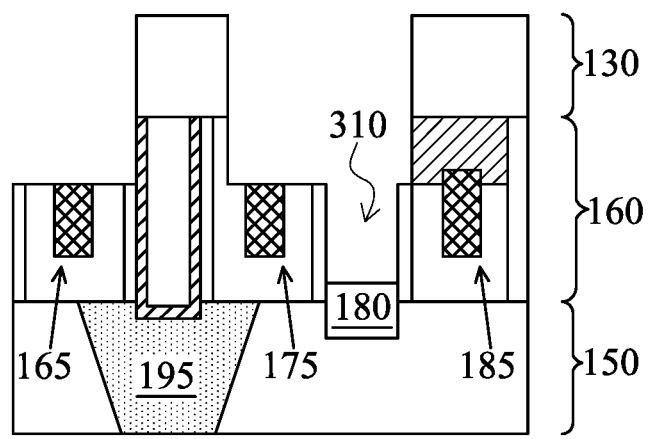

In FIG. 5, a fourth etching process is performed. The bottom photoresist layer 140 previously above the ILD layer 130 is substantially etched. An etchant used in the fourth etching process may have a high selectivity with the ILD layer 130 and the epitaxial layer 180.

Since the epitaxial layer 180 is exposed since the second etching process, the epitaxial layer 180 may be significantly damaged in following process. As a result, it may affect operations of the FinFET structure 100.

FIGS. 6-14 illustrate cross-sectional views of a FinFET structure 600 during formation of the FinFET structure 600 according to a first embodiment.

Figure 6:
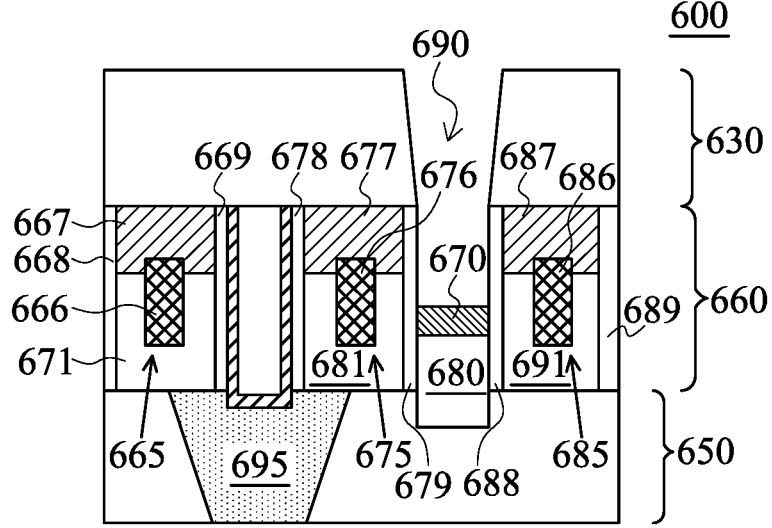
FIGS. 6-14 illustrate cross-sectional views of a FinFET structure during formation of the FinFET structure according to a first embodiment.

In FIG. 6, the FinFET structure 600 initially includes an inter-layer dielectric (ILD) layer 630, a gate layer 660, a substrate layer 650, a cap layer 670, and an epitaxial layer 680. A source/drain portion of the FinFET structure 600 includes the cap layer 670 and the epitaxial layer 680. A first trench 690 is formed by patterning the ILD layer 630, and is above the cap layer 670 and the epitaxial layer 680.

In one example, the cap layer 670 may consist essentially of silicon, and the epitaxial layer 680 may consist essentially of silicon-germanium.

The gate layer 660 may include three exemplary gate portions, including a first gate 665, a second gate 675, and a third gate 685. The first gate 665 includes a first metal portion 666, a first gate ceiling 667, a first gate bottom 671, a first left-side spacer 668, and a first right-side spacer 669. The second gate 675 includes a second metal portion 676, a second gate ceiling 677, a second gate bottom 681, a second left-side spacer 678, and a second right-side spacer 679. The third gate 685 includes a third metal portion 686, a third gate ceiling 687, a third gate bottom 691, a third left-side spacer 688, and a third right-side spacer 689.

The first gate ceiling 667, the second gate ceiling 677, and the third gate ceiling 687 may consist essentially of silicon nitride.

The FinFET structure 600 may further include a STI layer 695 for isolation. The STI layer 695 is interposed between the first gate 665 and the second gate 675.

Figure 7:
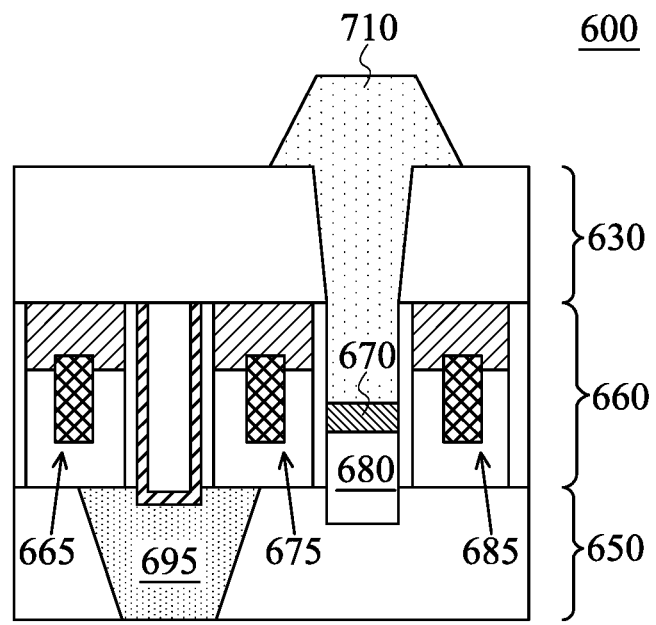

In FIG. 7 a protection layer 710 is formed within the first trench 690 for protecting the cap layer 670 and the epitaxial layer 680. In some examples, a material of the protection layer 710 may be germanium or silicon-germanium, so that the protection layer 710 is capable of withstanding some following-mentioned etching processes.

Figure 8:
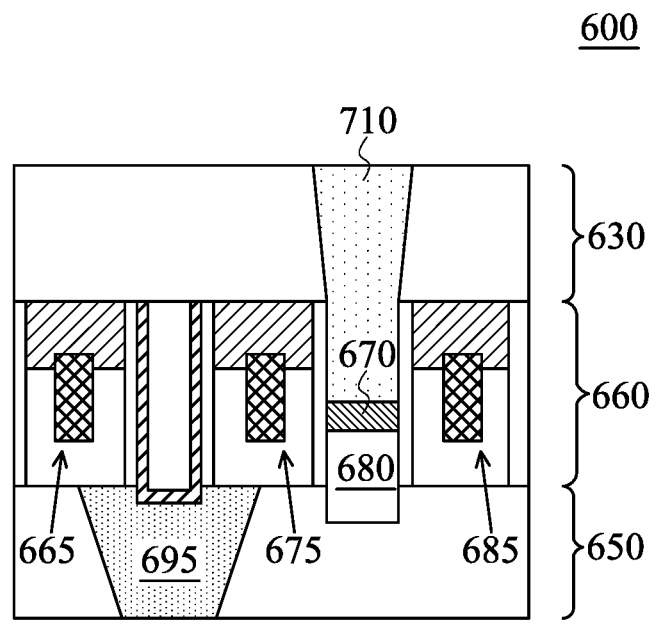

In an example, the protection layer 710 may protrude out of the trench 690. In FIG. 8, an additional chemical-mechanical polishing (CMP) may be utilized for planarizing a protruding portion of the protection layer 710.

Figure 9:
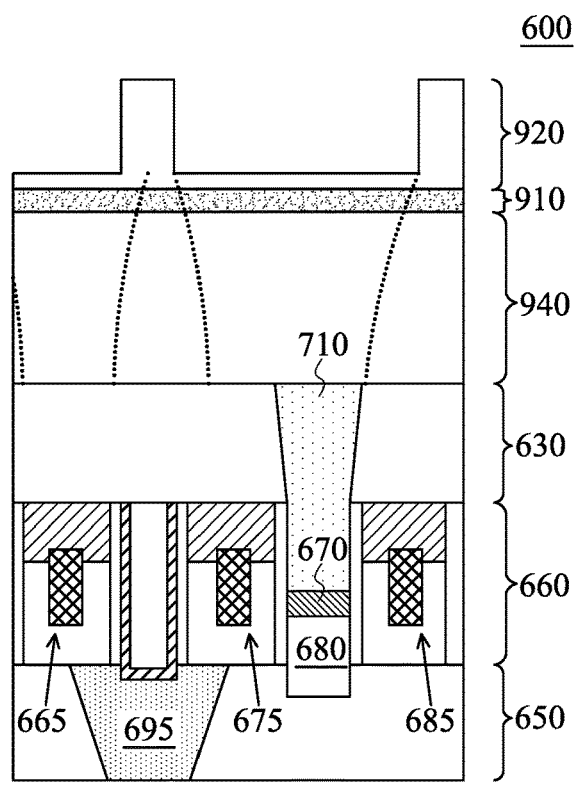

In FIG. 9, a bottom photoresist layer 940 is formed above the protection layer 710 and the ILD layer 630. A first photoresist layer 910 is formed above the bottom photoresist layer 940. A second photoresist layer 920 is formed above the first photoresist layer 910.

In one example, the first photoresist layer 910 may consist essentially of silicon and PR mixture.

Figure 10:
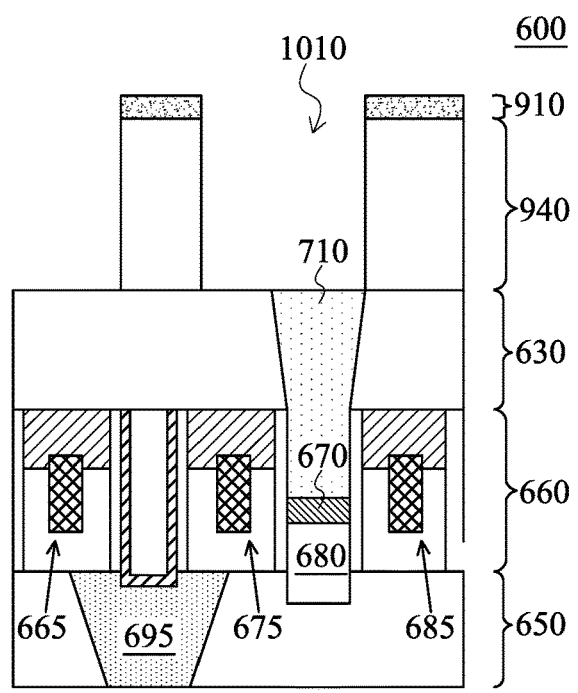

In FIG. 10, a first etching process is performed. The second photoresist layer 920 is substantially etched to pattern the bottom photoresist layer 940 and the first photoresist layer 910 for forming a second trench 1010. A first portion of the ILD layer 630 and a first portion of the protection layer 710 may be in direct contact with the second trench 1010.

In one example, an etchant used in the first etching process may have a high selectivity with the ILD layer 630. In another example, the etchant used in the first etching process may be gas selected from the group consisting of $N_2/H_2$-mixed gas, $O_2$ gas, $CO_2$ gas, CO gas, $SO_2$ gas, and etc.

Figure 11:
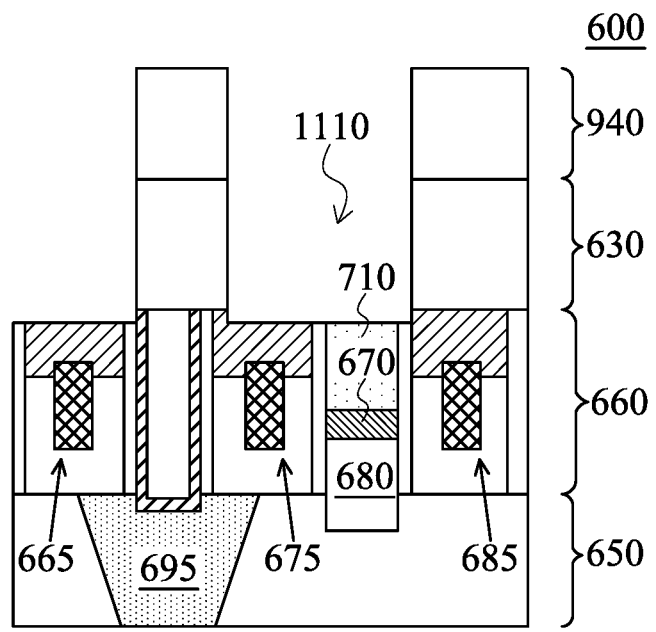

In FIG. 11, a second etching process is performed. The first photoresist layer 910, part of the ILD layer 630, and part of the protection layer 710 are substantially etched to form a third trench 1110. A second portion of the protection layer 710 may be in direct contact with the third trench 1110.

In one example, an etchant used in the second etching process may be $CF_4/CHF_3$-mixed gas.

Figure 12:
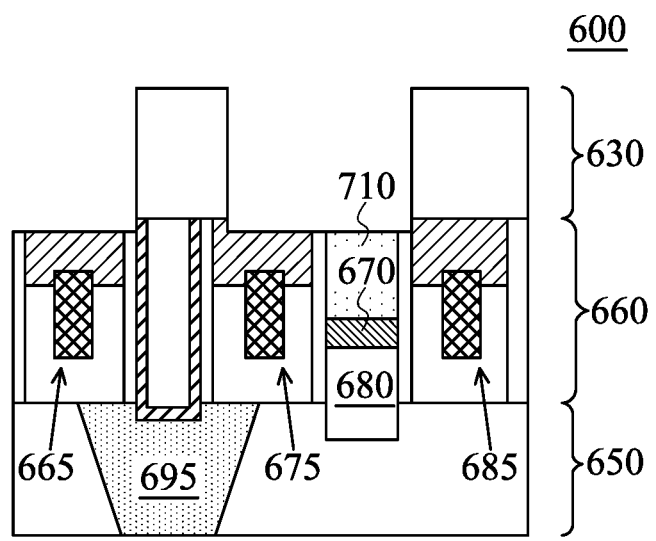

In FIG. 12, a third etching process is performed. The bottom photoresist layer 940 is substantially etched.

In one example, an etchant used in the third etching process is $O_2$ gas, or $N_2/H_2$-mixed gas, $CO_2$ gas, CO gas, $SO_2$ gas, and etc.

Figure 13:
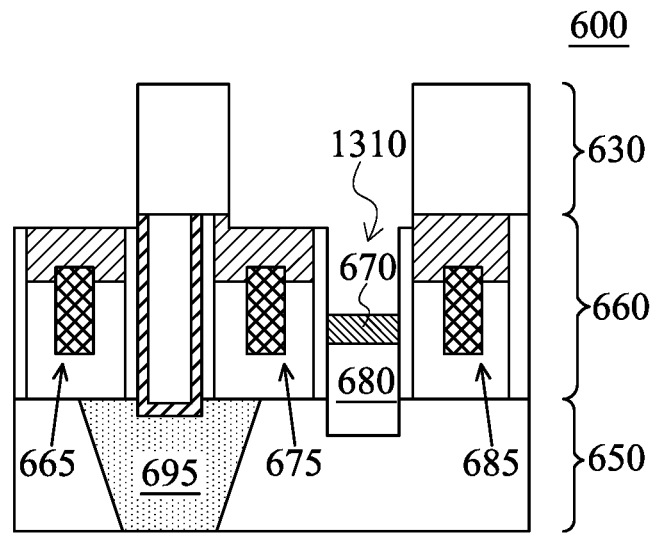

In FIG. 13, a fourth etching process is performed. The protection layer 710 is substantially etched to form a fourth trench 1310.

In a first example, the fourth etching process is a dry etching process.

In a second example, the fourth etching process is a wet etching process.

In a third example, an etchant used in the fourth etching process is sulfuric peroxide mixture (SPM).

In a fourth example, the etchant used in the fourth etching process is ammonia peroxide mixture (APM).

Figure 14:
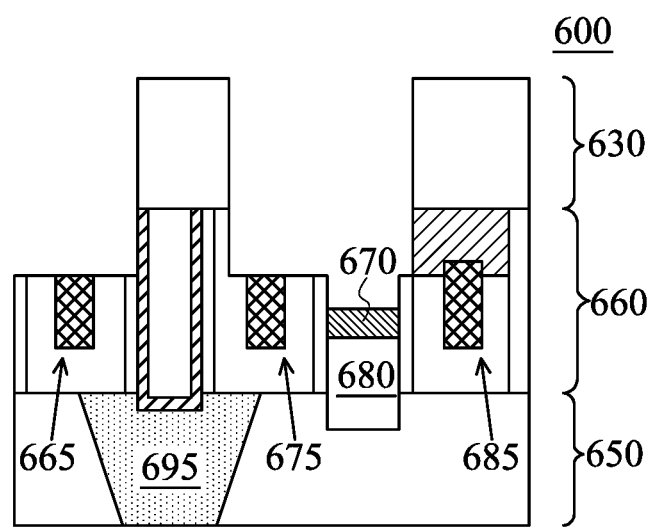

In FIG. 14, a fifth etching process is performed. Part of the first gate ceiling and the second gate ceiling are removed.

Since the cap layer 670 is protected by sacrificing the protection layer 710, the epitaxial layer 680 can still be protected by the cap layer 670. As a result, the epitaxial layer 680 can be alleviated from being damaged in following processes, and operational accuracy of the FinFET structure 600 can be preserved.

Figure 15:
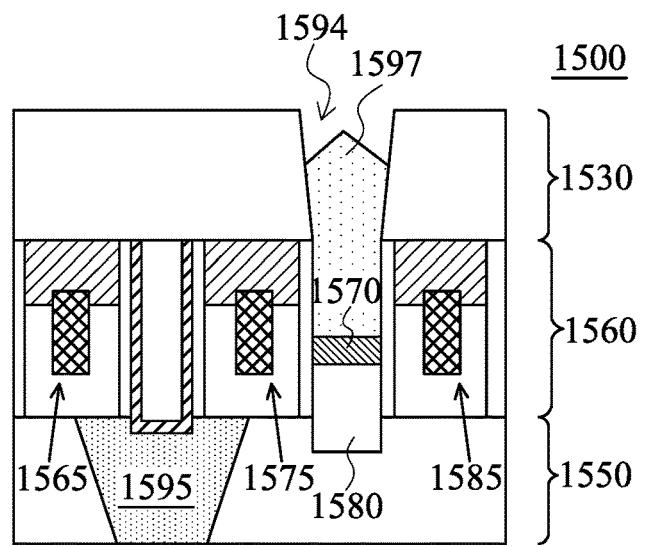
FIGS. 15-17 illustrate cross-sectional views of a FinFET structure during formation of the FinFET structure according to a second embodiment.
Figure 16:
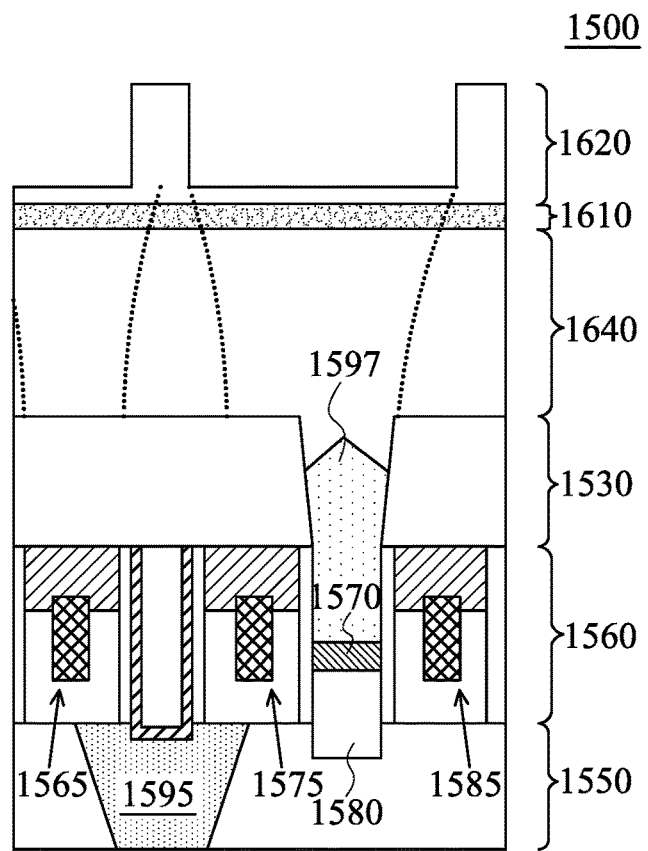
Figure 17:
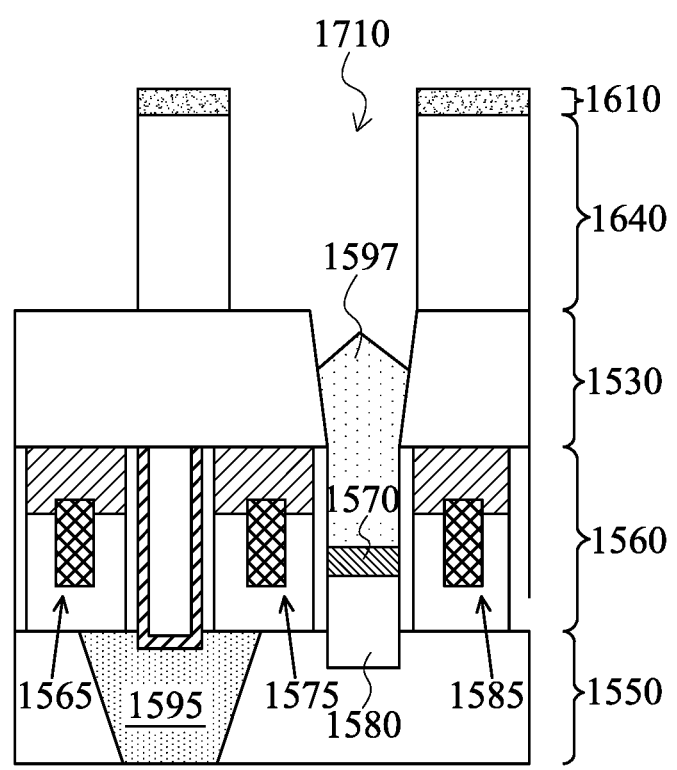

FIGS. 15-17 illustrate cross-sectional views of a FinFET structure 1500 during formation of the FinFET structure 1500 according to a second embodiment.

In FIG. 15, the FinFET structure 1500 initially includes an ILD layer 1530, a gate layer 1560, a substrate layer 1550, a cap layer 1570, and an epitaxial layer 1580. A source/drain portion of the FinFET structure 1500 includes the cap layer 1570 and the epitaxial layer 1580. A first trench 1594 is formed by patterning the ILD layer 1530, and is above the cap layer 1570 and the epitaxial layer 1580.

The gate layer 1560 may include three exemplary gate portions, including a first gate 1565, a second gate 1575, and a third gate 1585.

The FinFET structure 1500 may further include a STI layer 1595 for isolation. The STI layer 1595 is interposed between the first gate 1565 and the second gate 1575.

Unlike forming a protruding protection layer 710 in FIG. 7, a concave-topped protection layer 1597 is formed within the first trench 1594, as shown in FIG. 15.

In FIG. 16, an bottom photoresist layer 1640 is formed above the protection layer 1597 and the ILD layer 1530. A first photoresist layer 1610 is formed above the bottom photoresist layer 1640. A second photoresist layer 1620 is formed above the first photoresist layer 1610.

In FIG. 17, the second photoresist layer 1620 is substantially etched to pattern the bottom photoresist layer 1640 and the first photoresist layer 1610 for forming a second trench 1710.

After substantially etching the first photoresist layer 1610, part of the ILD layer 1530, and part of the protection layer 1597, the formation of the FinFET structure 1500 will be the same as shown in FIG. 12. The following processes to be performed on the FinFET structure 1500 are also the same as shown in FIGS. 13-14.

Therefore, the FinFET structure 1500 may also alleviate the epitaxial layer 1580 from being damaged in processes before the completion of forming the FinFET structure 1500.

Figure 18:
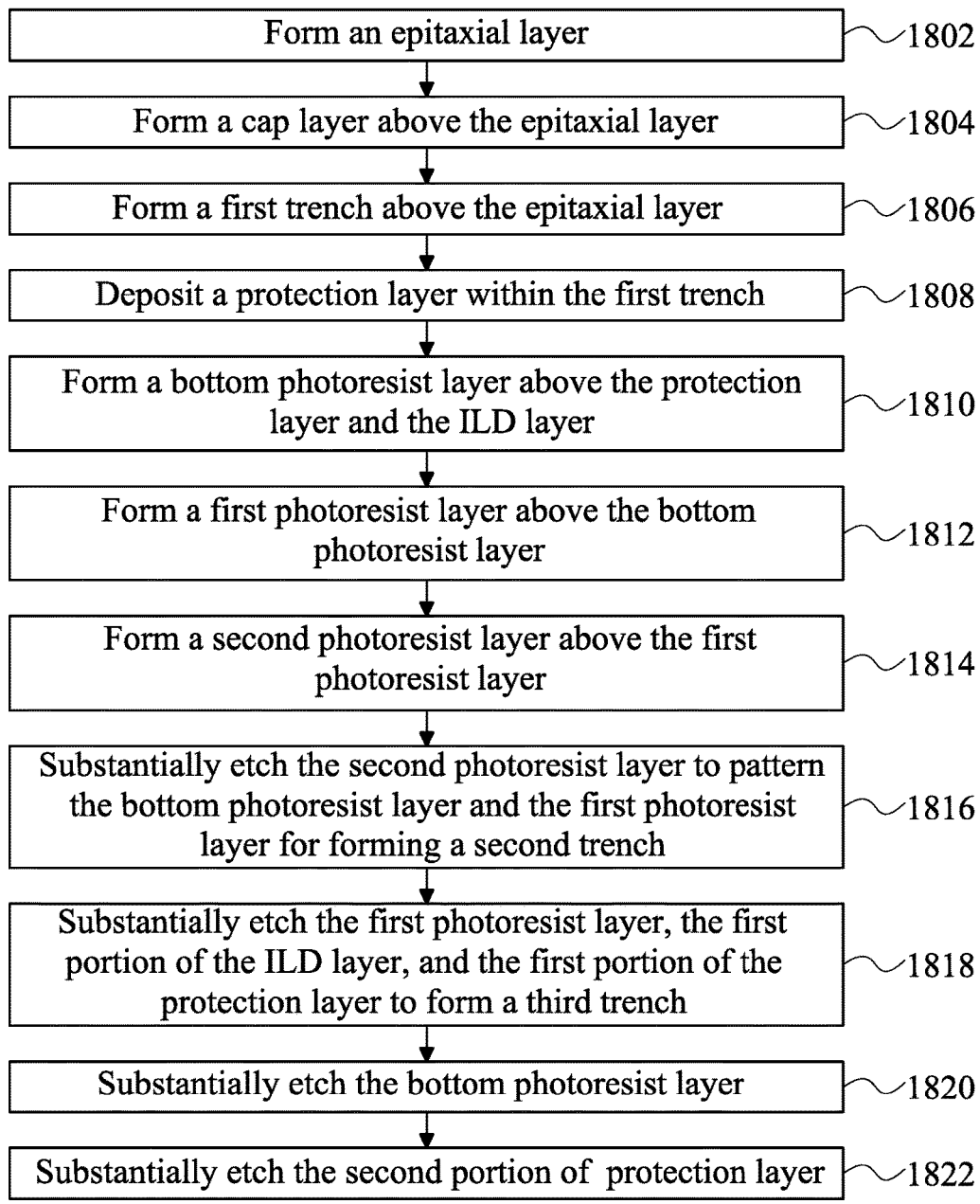
FIG. 18 illustrates a flowchart of a method of forming a MOSFET structure.

FIG. 18 illustrates a flowchart of a method of forming a MOSFET structure. The method includes the following stages: forming an epitaxial layer (1802); forming a cap layer above the epitaxial layer (1804); forming a first trench above the epitaxial layer (1806); depositing a protection layer within the first trench (1808); forming a bottom photoresist layer above the protection layer and the ILD layer (1810); forming a first photoresist layer above the bottom photoresist layer (1812); forming a second photoresist layer above the first photoresist layer (1814); substantially etching the second photoresist layer to pattern the bottom photoresist layer and the first photoresist layer for forming a second trench (1816); substantially etching the first photoresist layer, the first portion of the ILD layer, and the first portion of the protection layer to form a third trench (1818); substantially etching the bottom photoresist layer (1820). Substantially etch the second portion of the protection layer (1822).

This disclosure teaches a method, which comprises providing a semiconductor structure that includes an epitaxial layer and a cap layer above the epitaxial layer, filling a trench above the cap layer with a sacrificial layer, and removing the sacrificial layer.

This disclosure also teaches another method, which comprises: providing a semiconductor structure that includes a source/drain portion and a gate layer, wherein the source/drain portion has an epitaxial layer and a cap layer above the epitaxial layer; and etching the gate layer without damaging the epitaxial layer of the source/drain portion.

This disclosure also teaches a semiconductor structure, which comprises a gate layer and a source/drain region. An etching process is performed on the gate layer. The source/drain portion includes an epitaxial layer not damaged by the etching process.

This written description uses examples to disclose embodiments of the disclosure, include the best mode, and also to enable a person of ordinary skill in the art to make and use various embodiments of the disclosure. The patentable scope of the disclosure may include other examples that occur to those of ordinary skill in the art. One of ordinary skill in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiments. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. As an example, the structures, layouts, materials, operations, voltage levels, or current levels related to "source" and "drain" described herein (including in the claims) may be interchangeable as a result of transistors with "source" and "drain" being symmetrical devices. The term "substrate" may refer to any construction comprising one or more semiconductive materials, including, but not limited to, bulk semiconductive materials such as a semiconductive wafer (either alone or in assemblies comprising other materials thereon), and semiconductive material layers (either alone or in assemblies comprising other materials). The embodiments of a device or article described herein can be manufactured, used, or shipped in a number of positions and orientations. Persons skilled in the art will recognize various equivalent combinations and substitutions for various components shown in the figures.

What is claimed is:

1. A method comprising:
   providing a semiconductor structure that includes an epitaxial layer and a cap layer above the epitaxial layer;
   providing a gate layer adjacent to the epitaxial layer and the cap layer;
   providing a dielectric layer above the cap layer and the gate layer;
   forming a trench above the cap layer by patterning a portion of the dielectric layer above the cap layer, wherein sidewalls of the trench comprise the gate layer and the dielectric layer above the gate layer;
   filling the trench with a protection layer; and
   removing the protection layer.

2. The method of claim 1, wherein the epitaxial layer and the cap layer constitute a source/drain portion of the semiconductor structure.

3. The method of claim 1, wherein the trench extends through the dielectric layer, wherein filling the trench is such that the protection layer protrudes above the dielectric layer.

4. The method of claim 1, further comprising planarizing the protection layer.

5. The method of claim 1, wherein filling the trench is such that the protection layer partially fills the trench.

6. The method of claim 1, wherein the trench extends through the dielectric layer, the method further comprising, prior to removing the protection layer, etching the dielectric layer.

7. The method of claim 1, further comprising:
   providing a photoresist above the semiconductor structure; and
   prior to removing the protection layer, etching the photoresist.

8. The method of claim 1, further comprising etching the gate layer of the semiconductor structure.

9. The method of claim 8, wherein etching the gate layer is after removing the protection layer.

10. The method of claim 8, wherein etching the gate layer includes partially etching a gate of the gate layer.

11. A method comprising:
    providing a semiconductor structure that includes a source/drain portion, wherein the source/drain portion has an epitaxial layer and a cap layer above the epitaxial layer;
    providing a gate layer adjacent to the epitaxial layer and the cap layer;
    providing a dielectric layer above the cap layer;
    patterning a portion of the dielectric layer above the cap layer to form a trench above the cap layer, wherein sidewalls of the trench comprise the gate layer and the dielectric layer above the gate layer; and
    etching the gate layer without damaging the epitaxial layer of the source/drain portion.

12. The method of claim 11, further comprising:
    forming a protection layer above the cap layer; and
    removing the protection layer.

13. The method of claim 12, wherein the dielectric layer is positioned above the source/drain portion and the gate layer, the method further comprising, prior to removing the protection layer, etching the dielectric layer.

14. The method of claim 12, further comprising:
  providing a photoresist above the semiconductor structure; and
  prior to removing the protection layer, etching the photoresist.

15. The method of claim 12, wherein etching the gate layer is after removing the protection layer.

16. The method of claim 15, wherein etching the gate layer includes partially etching a gate of the gate layer.

17. The method of claim 15, wherein etching the gate layer includes substantially etching a gate ceiling of the gate layer.

18. A method comprising:
  providing a semiconductor structure that includes a source/drain portion, wherein the source/drain portion has an epitaxial layer and a cap layer above the epitaxial layer;
  providing a gate layer adjacent to the epitaxial layer and the cap layer;
  providing a dielectric layer above the cap layer and the gate layer;
  patterning a portion of the dielectric layer above the cap layer to form a trench above the cap layer, wherein sidewalls of the trench comprise the gate layer and the dielectric layer above the gate layer; and
  etching the gate layer without damaging the cap layer of the source/drain portion.

19. The method of claim 18, wherein etching the gate layer includes partially etching a gate of the gate layer.

20. The method of claim 18, further comprising:
  forming a protection layer above the cap layer; and
  removing the protection layer.

\* \* \* \* \*